United States Patent [19]

Richardson

[11] Patent Number: 4,803,378
[45] Date of Patent: Feb. 7, 1989

[54] PULSE GENERATOR

[75] Inventor: Robert Richardson, Essex, England

[73] Assignee: The Marconi Company Limited, Stanmore, England

[21] Appl. No.: 823,451

[22] Filed: Jan. 28, 1986

[30] Foreign Application Priority Data

Jan. 31, 1985 [GB] United Kingdom ............... 8502480

[51] Int. Cl.$^4$ ............................................. B23P 1/02
[52] U.S. Cl. .................................... 307/108; 307/106;
307/107; 328/67; 323/224; 323/282
[58] Field of Search ................. 307/88, 89, 96, 106,
307/107, 108, 109, 110, 246, 268, 132, 412, 414,
415, 416, 419, 420, 138; 328/65, 67; 331/157,
154, 87; 336/229, 212; 363/22, 24, 26, 31, 133;
361/245, 246; 323/224, 222, 282; 315/209 R,
209 CD, 241 R, 242

[56] References Cited

U.S. PATENT DOCUMENTS

| 3,139,585 | 6/1964 | Ross et al. ............... 328/67 X |
| 3,171,040 | 2/1965 | Goebel ..................... 328/67 X |
| 3,176,158 | 3/1965 | Guignard ................. 328/67 X |
| 3,263,099 | 7/1966 | Bedford ................... 307/109 |
| 3,296,551 | 1/1967 | Staples .................... 328/67 X |
| 3,486,043 | 12/1969 | Johannessen ............. 328/67 X |
| 3,518,527 | 6/1970 | Russell .................... 323/282 X |
| 3,531,712 | 9/1970 | Cecchini ................... 323/224 |
| 3,567,996 | 3/1971 | Gordon ..................... 307/107 X |
| 3,641,422 | 2/1972 | Farnsworth et al. ........ 323/224 |
| 3,655,994 | 4/1972 | Malme ..................... 307/106 X |
| 3,671,761 | 6/1972 | Shibuya et al. ............ 307/106 |
| 3,675,116 | 7/1972 | Israel ...................... 328/67 X |
| 3,749,976 | 7/1973 | Colyn ..................... 328/67 X |
| 3,849,670 | 11/1974 | Lourigan .................. 307/108 |
| 3,928,809 | 12/1975 | Tschudi et al. ........... 328/67 X |
| 3,931,528 | 1/1976 | Farnsworth et al. ....... 307/108 |
| 4,150,307 | 4/1979 | Loucks .................... 328/65 X |
| 4,394,583 | 7/1983 | Standing .................. 307/108 |
| 4,404,476 | 9/1983 | Lezan ..................... 307/268 |
| 4,456,835 | 6/1984 | Pichler et al. ............ 307/107 |

FOREIGN PATENT DOCUMENTS 2013050 10/1977 United Kingdom .
2155716 9/1985 United Kingdom ........... 307/107

Primary Examiner—William M. Shoop, Jr.
Assistant Examiner—Paul Ip

[57] ABSTRACT

A pulse generator comprises a capacitor, means for periodically discharging the capacitor to generate pulses of electricity and means for recharging the capacitor between pulses. Means is included for sensing a residual reverse polarity charge on the capacitor after generation of a pulse and for using the energy stored in it to assist in recharging the capacitor for the next pulse.

4 Claims, 3 Drawing Sheets

PULSE GENERATOR

BACKGROUND OF THE INVENTION (1) Field of the Invention

This invention relates to a pulse generator of the type comprising a capacitor, means for periodically discharging the capacitor to generate pulses of electricity and means for recharging the capacitor between pulses. The invention is particularly developed for use in supplying pulses to a microwave tube such as a magnetron in a radar transmitter.

In pulse generators of the aforementioned type the capacitor can develop a reverse charge under fault conditions usually related to sparking in the tube. This reverse charge can vary from a small inconsequencial value up to a value equal to the original forward charge. Large reverse charges can present a problem because they can lead to damaging transients which lead to circuit failure.

(2) Description of the Prior Art

The above problem has been dealt with in the past by the connection of a diode and resistor in series across the capacitor. This bleeds away the negative charge. Normal design practice requires the diode and resistor to be rated to handle the mean power of the modulator system. In a large radar transmitter this could be for example ten kilowatts. This generates new problems because the resistor is expensive, it generates substantial heat under fault conditions, it is bulky, and it is not easily integrated into modern solid state equipment. There is also of course considerable energy wastage.

BRIEF SUMMARY OF THE INVENTION

This invention has the object of eliminating the need for the aforementioned resistor and the attendant problems referred to. In accordance with the invention a pulse generator of the aforementioned type is provided with means for sensing a residual reverse polarity charge on the capacitor after generation of a pulse and for using the energy stored in it to assist in recharging the capacitor for the next pulse.

Because the energy stored in the capacitor when it is reverse charged is re-used, all the above problems are reduced or eliminated for minimal increase in circuit complexity.

The means for recharging the capacitor will normally include a D.C. supply connected to the capacitor via a series inductor to control the current demand from the D.C. supply.

The means for using the stored energy in the reverse charged capacitor to recharge it preferably includes an inductor and a switch for connecting the inductor across the capacitor. In this arrangement the switch is closed in response to detection of a reverse polarity of more than a particular amount so that the energy in the reverse charged capacitor commences to recharge it through the inductor in the forward direction. The abovementioned switch may then be opened and a second switch closed to connect a D.C. supply to the capacitor through the aforementioned inductor to ensure that the capacitor is fully recharged to a required value.

The aforementioned inductor is preferably the primary of a transformer whose secondary is connected to a charging regulator circuit e.g., following known design principles. It is a characteristic of charging regulators that they do not operate satisfactorily with a large reverse voltage on the capacitor. Thus an added benefit of the invention is that this charging regulator, if included as is preferred, is not subjected to such conditions.

DETAILED DESCRIPTION

Figure 1:
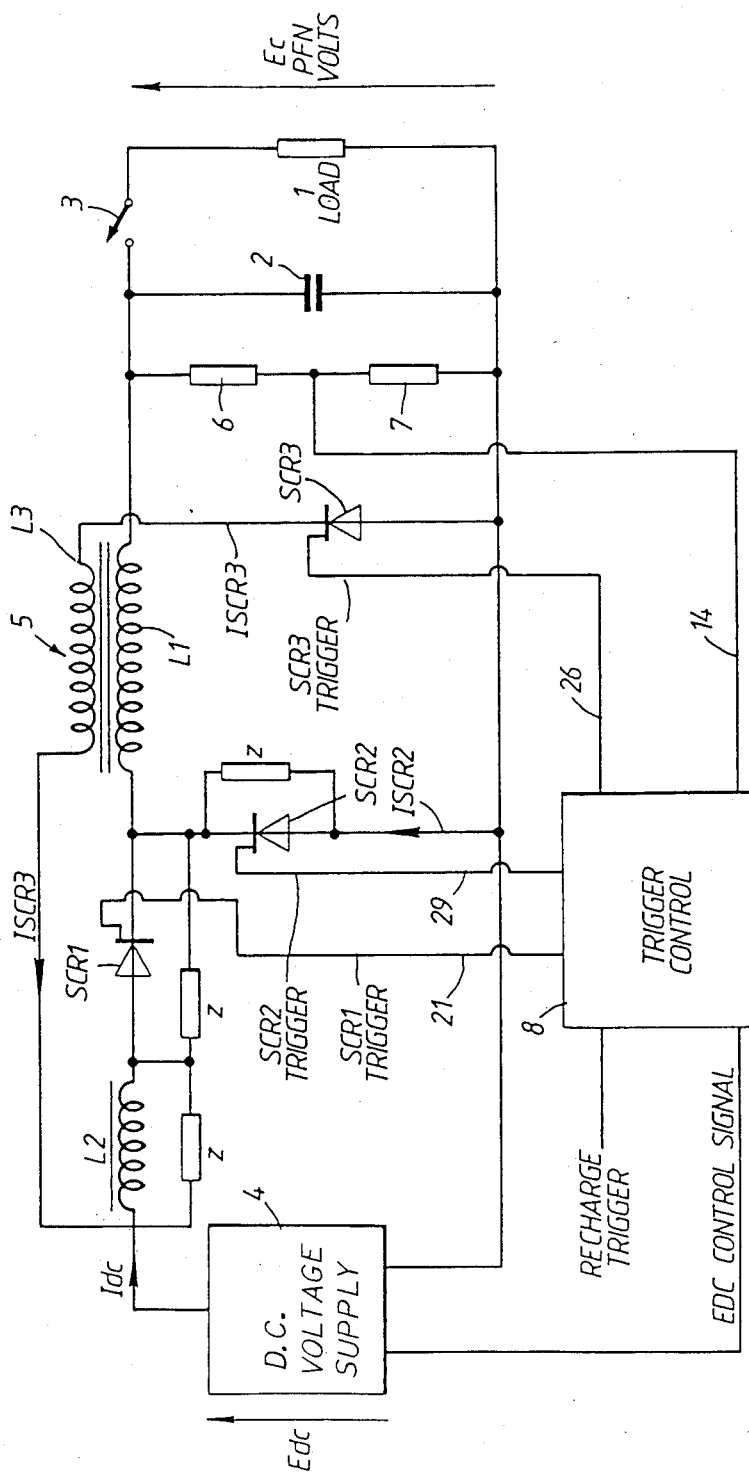
FIG. 1 is a schematic diagram of a pulse generator charging circuit incorporating the invention.

The circuit shown in FIG. 1 comprises a load 1 consisting of a magnetron and pulse transformer. This is driven by pulses of electricity from a capacitor 2 and switch 3.

Under normal operating conditions a D.C. voltage supply 4 charges the capacitor 2 through inductor L2, switch SCR1, and inductor L1 forming the primary of a transformer 5. When the capacitor 2 is fully charged the switch SCR1 is opened before the next pulse is produced by closing of switch 3. The maximum voltage to which the capacitor 2 is charged is controlled by a circuit comprising transformer secondary L3 and switch SCR3. At a predetermined time SCR3 is triggered to arrest charging of the capacitor 2 at the desired voltage, the excess energy in inductor L1 being diverted back to the D.C. supply 4. When SCR3 is closed the charge on the capacitor 2 is delivered to the load and under normal conditions the residual charge left on capacitor 2 is of little consequence to normal operation.

If the mangetron 1 short circuits the consequential rapid discharge of capacitor L2 leaves it with an indeterminate reverse voltage. A reverse voltage across capacitor 2 is detected by a potential divider 6 and 7 connected to a trigger control circuit 8 which causes a switch SCR2 to close thus allowing the reverse charge to flow into inductor L1 and to contribute to the recharge of the capacitor 2. The operation of the trigger control circuit 8 will be described later.

A more detailed description of operation of the circuit of FIG. 1 under fault conditions is as follows:

If the load 1 is a short circuit then upon discharge the capacitor 2 will be reversed to −En REV (C on FIG. 2) which can have a value of between 0 and −2 Edc dependign on the nature of the load fault. The reversed value of -En REV remains on the PFN until time tg, when SCR2 is triggered on.

Figure 2:
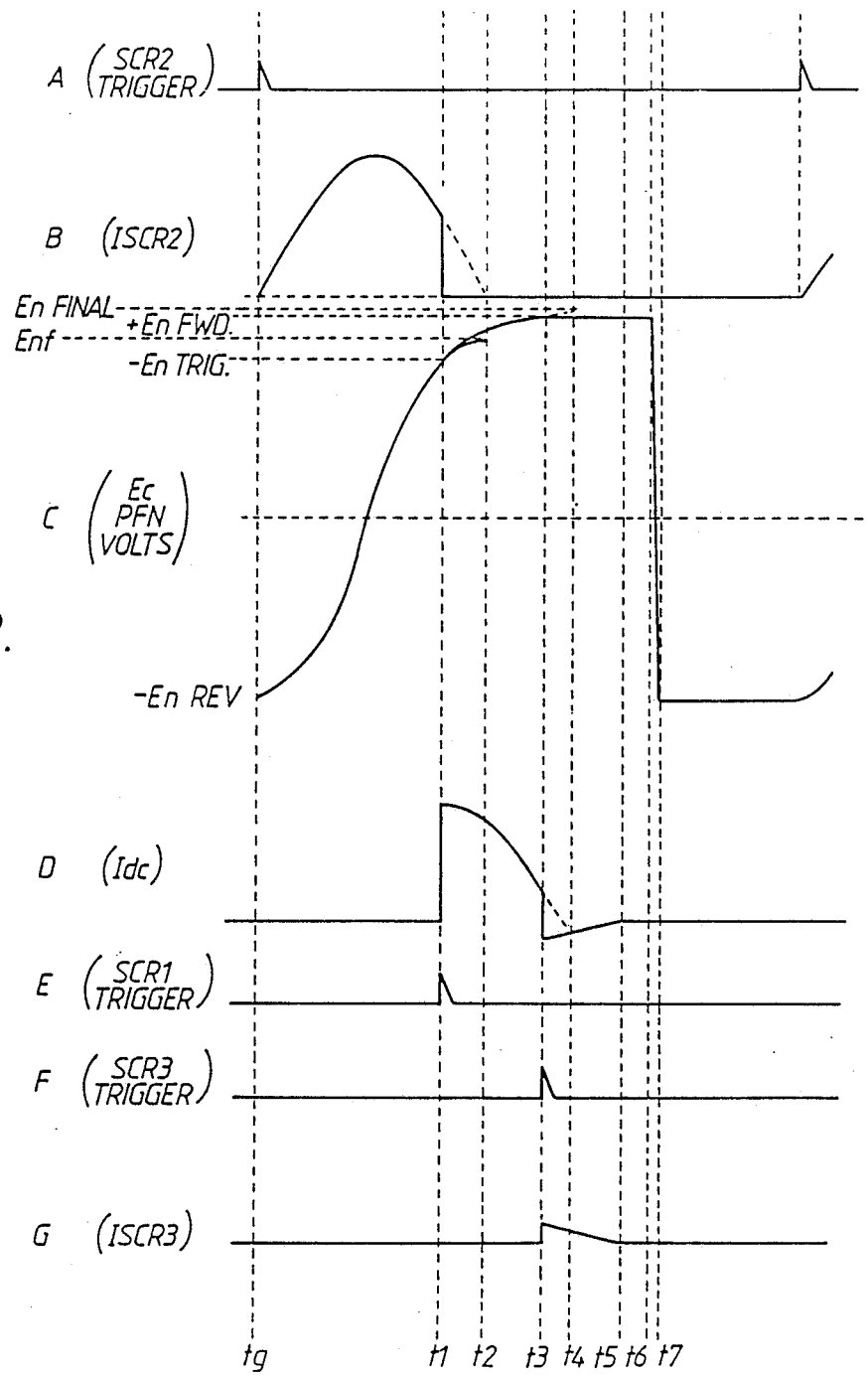
FIG. 2 shows at A,B,C,D,E,F and G currents and voltages SCR2, I SCR2, Ec (PFN volts), Idc, SCRI Trigger, SCR3 Trigger and ISCR3 appearing at the correspondingly denoted points on FIG. 1.

The PFN now starts to co-sinusoidally reverse aiming at Enf as shown at C on FIG. 2 with a half sine wave of current of peak value En REV Cn/L1. At a predetermined time t1 SCR1 is fired as shown at E on FIG. 2 at a voltage corresponding to En Trig as shown at C on FIG. 2. This action simultaneously turns off SCR2 and connects the D.C. supply 4 in series with L1 and capacitor 2. This raises the final voltage of capacitor 2 to En final as shown at C on FIG. 2 with a D.C. current demand as shown at D on FIG. 2. The current is of clipped sine form with a peak value equal to that of the current that was flowing in SCR2 at time t1. This current as shown at D on FIG. 2 would reach zero at time t4.

If, however, the regulator SCR3 is fired at say t3 then the ouptut Idc will fall to zero and the excess current will flow back into the D.C. supply as shown at D on FIG. 2: stopping at time t5.

At time t3 the regulator arrests charging at +En fwd which is the desired PFN charging voltage of capacitor 2.

Although not immediately apparent from the waveforms the effective current delivered by the D.C. supply 4 and shown at D on FIG. 2 is in fact the difference between normal energy and the reversed energy with due allowance for circuit losses. The bulk of the forward energy in the capacitor is recovered from the reversed energy caused by the load short circuit fault conditions. The inductor L2 in series with SCR1 is to prevent too rapid a turn off of SCR2 when SCR1 is triggered on as this can damage SCR1 and/or SCR2. Also the impedances shown as Z across SCR1 and SCR2 will usually be required to clamp excess ringing during turn off of SCR's. Such impedances are usually known as 'snubbers' and they are specified to damp out the effects of stray inductance and capacitance. However correctly designed the effects of L2 and resistors Z will be barely detectable on correct circuit operation.

One particular mode of operation is particularly satisfactory. This mode of operation occurs by letting the value of En trig FIG. (2B) (i.e., the time t1 when SCR1 is triggered) be determined by the value of the original fault reversal on the capacitor 2. Then the operating conditions for the regulator (SCR3 and L3 secondary) will be very similar if not identical in terms of clipper current (G on FIG. 2) and clipper stop time t3-t5 (FIG. 2) as they are under normal operating conditons (i.e., when the capacitor 2 is recharged from OV).

It is desirable that all circuit voltage levels including the control of the voltage supply 4 and the trigger control 8 be derived from a single variable source thus allowing operation of any desired level of charge on capacitor 2 with a single control. A desirable feature of the illustrated circuit is that under normal conditions it automatically reverts to normal operation as previously described.

In a pulse modulator system it is normal practice to provide a recharge trigger timed at tg (FIG. 2) and a subsequent trigger timed at t6. The discharge trigger closes switch 3 and the recharge trigger is applied to terminal 9 on the trigger control circuit 8 which is shown in detail in FIG. 3.

Figure 3:
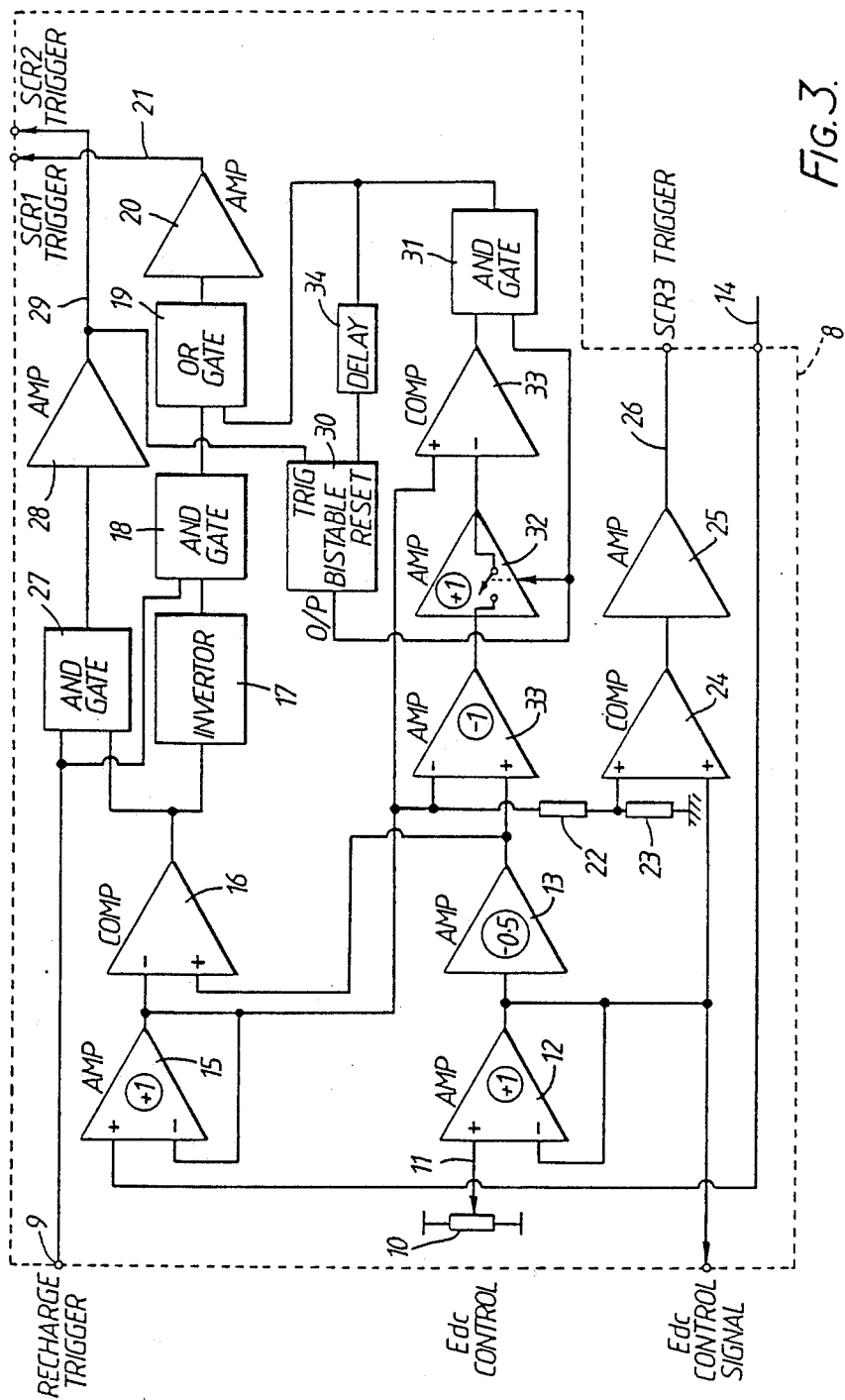
FIG. 3 is a block diagram of the trigger control circuit of FIG. 1.

Referring to FIG. 3 a manual control 10 is adjusted to provide a reference voltage at 11 which is fed into a unity gain amplifier 12 and then to an amplifier 13 having a gain of −0.5 in this example. This value establishes the degree of reversal of the voltage on capacitor 2 at which a fault condition is defined as existing.

A measure of the voltage on capacitor C, from the potential divider 6, 7 is applied on line 14 to a unity gain buffer amplifier 15 and thence to comparator 16 where it is compared with the reference voltage from 13. When no fault condition applies the output of comparator 16 stays low. Thus the output of invertor 17 is high, enabling AND gate 18 to pass a recharge trigger when appearing at 9. This recharge trigger is fed via OR gate 19 and amplifier 20 to line 21 where it provides the trigger for switch SCR1. Thus the recharge trigger at 9, is under no fault conditions, fed directly to SCR1. After triggering of SCR1 recharging of capacitor 2 commences and the voltage on line 14 rises. This is applied via 15 and a potential divider 22 and 23 to comparator 24 which also receives the output of unity gain buffer 12. When the charge on 2 reaches a prescribed value comparator output 24 goes high and is applied to the gate of SCR3 via amplifer 25 and line 26.

If the load 1 sparks on discharge and the capacitor 2 is left with an excessive negative voltage the resulting signal on line 14 causes the output of comparator 16 to go high thus enabling AND gate 27. Now, when a recharge trigger appears at 9 it is applied firstly via AND gate 27 and amplifier 28 and line 29 to the gate of SCR2. It is also applied from the output of amplifier 28 to bistable 30 whose output goes high thus enabling and gate 31 and enabling the hold function of a sample and hold amplifier 32 which stores a positive voltage from inverting unity gain amplifier 33 proportional to the difference between the fault condition voltage on 2 and half the HT voltage Edc of soruce 4. The trigger of SCR2 allows the reverse charge on capacitor 2 to commence reversal back to a positive voltage via L1. When the positive voltage on line 14, fed via buffer 15 to comparator 33 reaches the reference set by the sample and hold amplifier 32, the comparator 33 output goes high and passes via an AND gate 31, OR gate 19, amplifier 20 and line 21 to the gate of SCR1 to complete the recharging of capacitor 2 which is brought to precisely the required voltage by the operation of the regulator system 22 to 26 as previously described.

The output of AND gate 31 is fed via delay 34 to reset bistable 30 and thus returns sample and hold amplifier 32 to its sample mode and disenables AND gate 31.

I claim:

1. A pulse generator, comprising:
   a capacitor:
   means for periodically discharging the capacitor to generate pulses of electricity;
   means for recharging the capacitor between pulses;
   sensing means for sensing a residual reverse polarity charge on the capacitor after generation of a pulse; and
   residual charge utilization means controlled by the sensing means so that in response to the sensing of a reverse polarity charge the residual charge utilization means uses energy stored in the capacitor by virtue of the reverse charge to assist in recharging the capacitor for the next pulse,
   wherein the means for recharging comprises an inductor, wherein the residual charge utilization means comprises a first switch for connecting the inductor across the capacitor, and wherein the sensing means comprises means for closing the first switch in response to detection of the reverse polarity charge and for opening the first switch when the energy giving the capacitor the reverse polarity charge has discharged through the inductor and recharged the capacitor with a forward charge.

2. A pulse generator according to claim 1, wherein the means for recharging further comprises a second switch, and a source of voltage arranged to charge the capacitor through the inductor via the second switch, and wherein the means for sensing additionally includes means for closing the second switch to commence or complete recharging of the capacitor.

3. A pulse generator according to claim 2, wherein the means for closing the first switch and the means for closing the second switch comprise a comparator for comparing a reverse voltage on the capacitor with a reference, and arranged so that when the reverse voltage exceeds the reference the first switch is closed in response to a received recharge trigger signal thereby recharging the capacitor with a forward charge and then closing the second switch to complete the charging process, and so that at other times only the second switch is closed in response to the recharge trigger signal.

4. A pulse generator according to claim 1, wherein the means for periodically discharging the capacitor comprises means for periodically connecting the capacitor across a load.

* * * * *